(12) United States Patent
Hohenwarter

(10) Patent No.: US 8,955,529 B2
(45) Date of Patent: Feb. 17, 2015

(54) DEVICE AND METHOD FOR WET TREATING DISC-SHAPED ARTICLES

(75) Inventor: Karl-Heinz Hohenwarter, Dallach/Gail (AT)

(73) Assignee: Lam Research AG, Villach (AT)

( * ) Notice: Subject to any disclaimer, the term of this patent is extended or adjusted under 35 U.S.C. 154(b) by 871 days.

(21) Appl. No.: 12/651,530

(22) Filed: Jan. 4, 2010

(65) Prior Publication Data

US 2010/0101424 A1 Apr. 29, 2010

Related U.S. Application Data

(62) Division of application No. 10/549,620, filed as application No. PCT/IB2004/050238 on Mar. 12, 2004, now Pat. No. 7,837,803.

(30) Foreign Application Priority Data

Mar. 20, 2003 (AT) .................................. A 444/2003

(51) Int. Cl.
  *B08B 3/00* (2006.01)
  *H01L 21/67* (2006.01)

(52) U.S. Cl.
  CPC ...... *H01L 21/6708* (2013.01); *H01L 21/67051* (2013.01); *Y10S 134/902* (2013.01)
  USPC ........ 134/96.1; 134/94.1; 134/98.1; 134/902; 118/52; 118/54; 156/345.11

(58) Field of Classification Search
  USPC ......... 134/94.1, 96.1, 98.1, 902; 118/520, 52, 118/54, 56, 602, 603; 156/345.11, 345.18
  See application file for complete search history.

(56) References Cited

U.S. PATENT DOCUMENTS

| | | | |
|---|---|---|---|
| 4,871,471 A | 10/1989 | Okuda | |
| 4,903,717 A * | 2/1990 | Sumnitsch | 134/99.1 |
| 5,070,813 A * | 12/1991 | Sakai et al. | 118/695 |
| 5,273,589 A | 12/1993 | Hussain | |
| 5,678,116 A | 10/1997 | Kitagawa | |
| 5,711,809 A * | 1/1998 | Kimura et al. | 118/663 |
| 5,718,763 A | 2/1998 | Tateyama | |
| 6,572,701 B2 | 6/2003 | Yamauchi | |
| 6,589,338 B1 | 7/2003 | Nakamori | |
| 7,074,726 B2 | 7/2006 | Sugimoto | |
| 2003/0140949 A1* | 7/2003 | Sugimoto et al. | 134/33 |
| 2004/0050491 A1 | 3/2004 | Izumi | |

FOREIGN PATENT DOCUMENTS

| | | |
|---|---|---|
| DE | 198 07 460 | 4/1999 |
| JP | 9-243419 | 9/1997 |
| JP | 11-87226 | 3/1999 |
| JP | 2001-44164 | 2/2001 |
| JP | 2002-246301 | 8/2002 |
| JP | 2002-305177 | 10/2002 |
| JP | 2002305177 | * 10/2002 |
| JP | 2002-329705 | 11/2002 |

OTHER PUBLICATIONS

Patent Abstracts of Japan vol. 2000, No. 20, Jul. 10, 2001 & JP 2001 077082 A (Takita Corp), Mar. 23, 2001.

* cited by examiner

*Primary Examiner* — Saeed T Chaudhry
(74) *Attorney, Agent, or Firm* — Young & Thompson

(57) ABSTRACT

In a spin-chuck with plural collector levels, a separate exhaust controller is provided for each level. This permits selectively varying gas flow conditions among the collector levels, so that the ambient pressure at one level does not adversely affect device performance in an adjacent level.

5 Claims, 2 Drawing Sheets

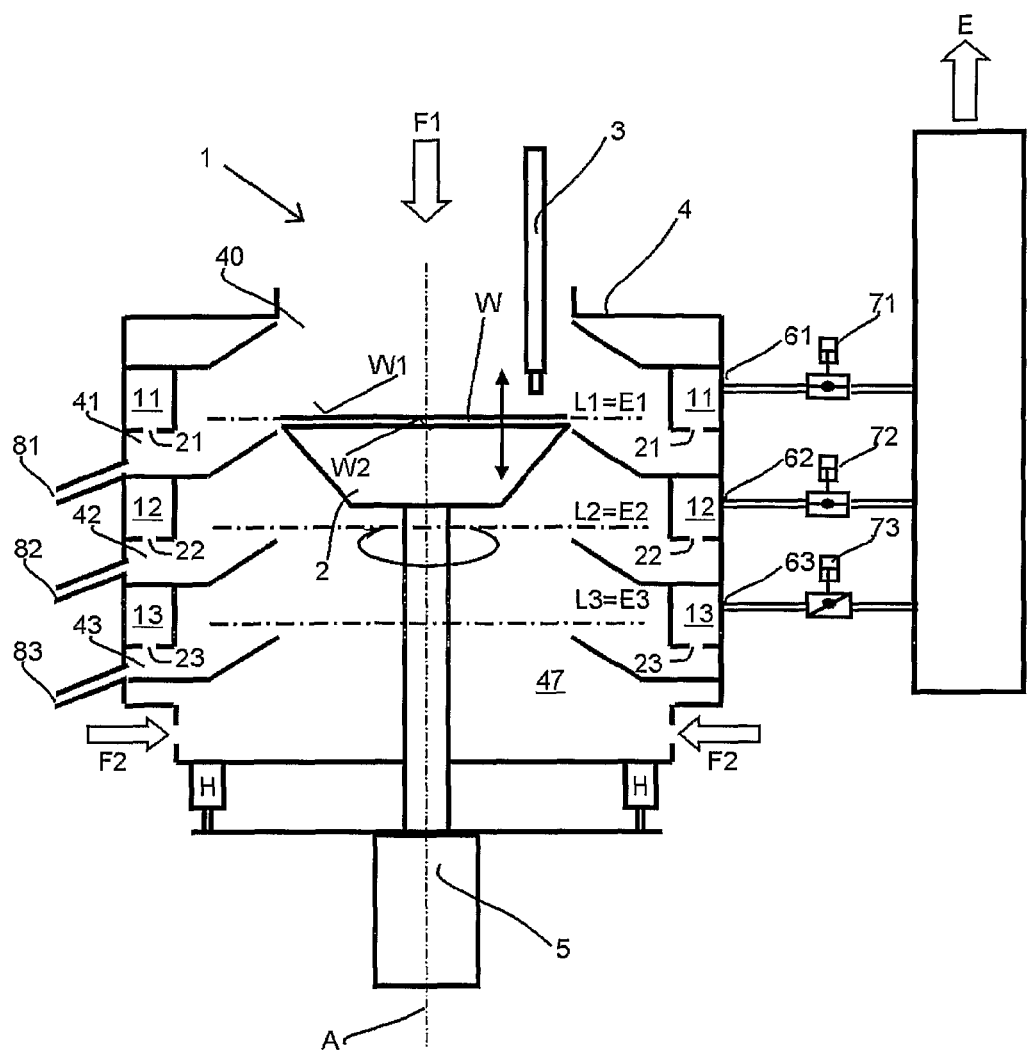

DEVICE AND METHOD FOR WET TREATING DISC-SHAPED ARTICLES

CROSS REFERENCE TO RELATED APPLICATIONS

This application is a division of co-pending application Ser. No. 10/549,620 filed on Dec. 4, 2006, which is the 35 U.S.C. §371 national stage of International PCT/IB2004/050238 filed on Mar. 12, 2004, which claims priority to Austrian Application No. A 444/2003 filed on Mar. 20, 2003. The entire contents of each of the above-identified applications are hereby incorporated by reference. Any disclaimer that may have occurred during prosecution of the above referenced applications is hereby expressly disclaimed.

FIELD OF THE INVENTION

The invention relates to a device and a method for wet treating a flat plate-like substrate, such as semiconductor wafers, flat panel displays or compact discs. The device comprising a spin-chuck for holding and rotating the substrate, at least one dispenser for dispensing a liquid onto at least one surface of said substrate, a liquid collector circumferentially surrounding said spin-chuck for collecting liquid, which is spun off the substrate during rotation. The liquid collector has at least two collector levels. Each of the collector levels has the purpose of separately collecting liquids in different collectors.

The device further comprises lifting means for moving spin-chuck relative to liquid collector substantially along the rotation axis and at least two exhaust levels for separately collecting gas from the interior of the liquid collector. Collecting gas from the interior of the liquid collector is useful to avoid deposition of mist being generated when liquid is spun off the substrate.

BACKGROUND OF THE INVENTION

Such a liquid collector often is called a "cup" even though it does not necessarily have a closed bottom. Another word often used for the liquid collector is "chamber" even though it is not closed on all sides.

Such a device is known in the art and described in details in U.S. Pat. No. 4,903,717. This patent shows each collector of each collector level being connected to a common exhaust. Each collector level thereby simultaneously serves as an exhaust level. Therefore while the common exhaust is turned on gas is sucked from the interior of the liquid collector by each exhaust level.

During processing it might happen that below the level of the spin-chuck the gas pressure is lower than ambient gas pressure. Consequently liquid which is ought to be spun in to a specific collector level might be partly sucked into the collector level below the selected collector level.

If a liquid X is brought to a wrong collector level in which a different liquid Y shall be collected liquid X will contaminate liquid Y. In the worst case liquids X and Y react with one another generating hazardous or flammable reaction products.

Another undesired result might happen if liquid Y is recycled in order to treat as many substrates as possible. A contamination of liquid Y with liquid X then might result in the destruction of the substrates treated thereafter. In this case another consequence could be a significant decrease of the shelf life of liquid Y.

SUMMARY OF THE INVENTION

Thus it is an object of the invention to avoid liquid being partly sucked into the collector level not actually selected to collect that liquid.

Another object of the invention is to decrease the necessary exhaust flow. This is not only because a high exhaust volume per time unit raises process cost, but also because too high exhaust sucks too much liquid into the exhaust, which has the disadvantages of high liquid consumption and of high afford for cleaning the exhausted air.

The invention meets the objects by providing a device for wet treating a flat platelike substrate comprising: a spin-chuck for holding and rotating the substrate; at least one dispenser for dispensing a liquid onto at least one surface of said substrate; a liquid collector circumferentially surrounding said spin-chuck for collecting liquid, which is spun off the substrate during rotation, with at least two collector levels, for separately collecting liquids in different collectors; lifting means for moving spin-chuck relative to liquid collector substantially along the rotation axis; at least two exhaust levels for separately collecting gas from the interior of the liquid collector; at least one exhaust influencing means, which is associated with at least one of said at least two exhaust levels, for selectively varying gas flow conditions in at least on of said at least two exhaust levels.

The dispenser can be configured in different ways, e.g. so that liquid sprays onto a substrate or runs onto the substrate in a continuous, turbulence-free way. The dispenser can be configured either to be directed towards the lower surface of a substrate when processed, therefore directed upwards, or towards the upper surface of a substrate when processed, therefore directed downwards. In both cases the dispenser can be configured to be horizontally moved during processing. It is further possible to use dispensers of both configurations, which allows to apply liquid onto both surfaces of the substrate even at the same time.

The spin-chuck can for instance be a vacuum-chuck, a Bernoulli-chuck, a chuck gripping the edge of the substrate only (edge contact only=EeG) or a combination of such types.

Each exhaust level comprises interiorly open suction orifices. The suction orifices may be an annularly arranged plurality of suction nozzles. Another possibility is to provide one annular slit-shaped nozzle. In any case it is advantageous to provide an annular gas-collecting chamber to circumferentially equalize gas flow conditions in one and the same exhaust level.

An advantage of the invention is that a significant reduction of the exhausted volume is possible and that cross-contamination between two neighboured collector levels can be avoided.

Optionally the device has exhaust influencing means, which are flow control modulating valve, such as a butterfly valve. This allows not only to shut off an exhaust level, but also to precisely lower gas flow in every exhaust level.

In an advantageous device the at least one exhaust influencing means is a closing valve, whereby one of the at least two exhaust levels can be closed. Such a configuration allows an easier control.

In another embodiment the device comprises controlling means whereby the at least one exhaust influencing means is controlled in dependence of the relative position of spin-chuck to liquid collector. Although this can be carried out easily in a mechanic way by connecting exhaust influencing means direct with the lifting means this will typically be done by a computer. In the latter case the computer receives information about the relative position of chuck to liquid collector either directly from the lifting means or electronic detectors detect the position.

If the suction orifices of at least one of the exhaust levels are connected to one of the two collector levels this collector level at the same time serves as exhaust level. The gas is sucked from the interior of the liquid collector into the collector level and therein separated from the liquid.

Yet another embodiment has at least one of the at least two exhaust levels arranged above or below of a collector level. In this case the collector level only collects liquid and does not suck gas as well. This brings the advantage that gas and liquid do not have to be separated after being collected.

Another aspect of the invention is a method of controlling the gas flow within a device for wet treating a flat plate-like substrate. The device comprises a spin-chuck for holding and rotating the substrate, at least one dispenser for dispensing a liquid onto at least one surface of said substrate, a liquid collector circumferentially surrounding said spin-chuck for collecting liquid, which is spun of the substrate during rotation. The liquid collector comprises at least two collector levels for separately collecting liquids. The device further comprises lifting means for moving spin-chuck relative to liquid collector substantially along the rotation axis and at least two exhaust levels for separately collecting gas from the interior of the liquid collector. The method is characterized in selectively generating different gas flow conditions in at least two of said exhaust levels.

In an embodiment the different gas flow conditions are selected in a way to achieve substantially the same gas pressure adjacent to the rotating substrate above and below Further details and advantages of the invention can be realized from the detailed description of a preferred embodiment.

BRIEF DESCRIPTION OF THE DRAWINGS

FIG. 2 shows a schematic cross section of a second embodiment of the invention.

DETAILED DESCRIPTION OF THE INVENTION

Figure 1:
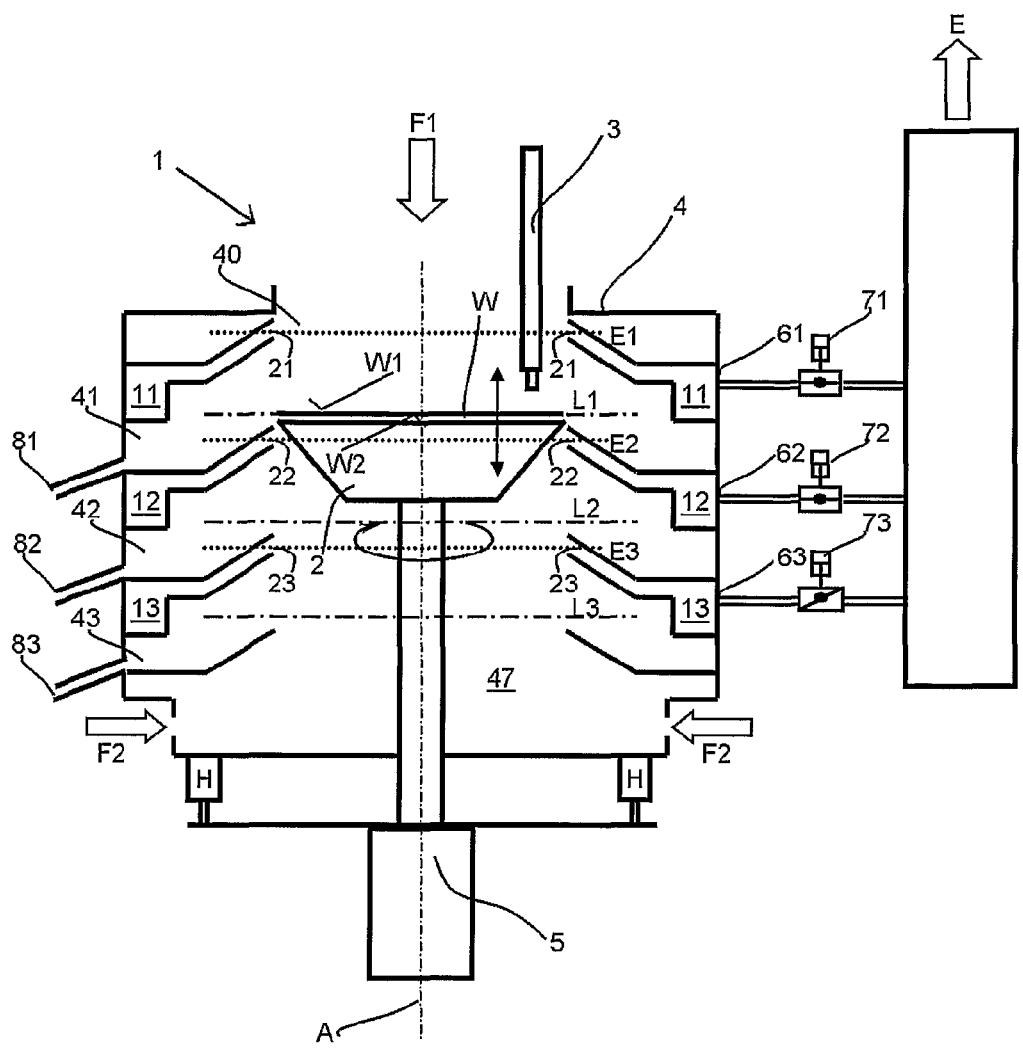
FIG. 1 shows a schematic cross section of a first embodiment of the invention.

FIG. 1 shows a device 1 comprising a spin-chuck 2 for holding and rotating a substrate W. The substrate has a first side WI and a second side W2. The spin-chuck is connected to a gear motor unit 5 to be rotated about its axis A. Dispense arm 3 is used for dispensing liquid onto the first surface WI of the substrate W.

A cup-like liquid collector 4 circumferentially surrounds the spin-chuck 2. The liquid collector is mounted on a frame (not shown). Lifting means H are provided to alter the spin-chuck position relative to the liquid collector. Thus the spin-chuck can be lifted to each of the three collector levels L1, L2 and L3. Each collector level L1, L2, L3 comprises an annular duct 41, 42, 43 to have spun off liquid collected therein. An additional splash guard (not shown) can be used for each collector to allow spun off liquid to hit it at an acute angle and thereafter to be directed to the annular duct. Each annular duct 41,42,43 is connected to a pipe 81,82,83 through which the collected liquid is drained. Drained liquid can immediately be reused to be dispensed to the substrate or collected as waste liquid. Each collector level L1, L2, L3 is for collecting different liquids. L1 is for collecting rinse liquid (e.g. DI-water), L2 for acidic liquids and L3 for basic liquids.

The dash dotted lines indicate the planes, where the substrate is to be placed for spinning off the liquids into the different collector levels.

Above each collector level L1, L2, L3 an exhaust level E1, E2, E3 is arranged substantially parallel to the collector level. The exhaust levels are indicated by dotted lines. Each exhaust level comprises a plurality of interiorly open annularly arranged suction orifices 21, 22, 23. Each array of the plurality of suction orifices 21,22 or 23 is connected to a separate ring-shaped gas-collecting chamber 11, 12, 13 respectively.

Each gas-collecting chamber is sucked off via a pipe 61, 62, 63. In each pipe 61,62, 63 is controlled by a valve 71, 72, 73. In the shown embodiment the valves are butterfly valves. This gives the advantage that the valve does not have to be totally closed but can be almost closed so that still a very small amount of gas can be sucked off in that specific suction level.

Most of the gas flow (air) that is sucked from the interior 40 of the liquid collector is provided from above (first gas-flow F1). Additional openings are provided, which connect the interior of the liquid collector below the chuck with the exterior. This results in a second gas-flow F2, which is preferably feed with clean air either from the surrounding clean room or from a separate source. Means for selectively modulating the second gas-flow can be provided.

The following table shows possible conditions for running the device 1 as shown in FIG. 1:

TABLE 1

| | Chuck Position | | |
|---|---|---|---|
| | upper exhaust level E1 | middle exhaust level E2 | lower exhaust level E3 |
| upper collector level L1 (FIG. 1) | 100% open | 80% open | closed |
| middle collector level L2 | 10% open | 100% open | 60% open |
| lower collector level L3 | closed | 10% open | 100% open |

A computer can automatically select the status of each exhaust level in dependence of the position of the chuck.

FIG. 2 shows a second embodiment of the invention similar to the first embodiment with the following differences. The exhaust orifices 21,22,23 are connected to the collector levels. Thus the collector levels L1, L2, L3 serve at the same time as exhaust levels E1, E2, E3. To equalize suction conditions circumferentially around each exhaust level each array of suction orifices is connected to an annular gas-collector chamber.

The following table shows possible conditions for running the device 1 as shown in FIG. 2:

TABLE 2

| | Chuck Position | | |
|---|---|---|---|
| | upper exhaust level E1 | middle exhaust level E2 | lower exhaust level E3 |
| upper collector level L1 (FIG. 1) | 100% open | 10% open | closed |
| middle collector level L2 | 10% open | 100% open | 10% open |
| lower collector level L3 | closed | 10% open | 100% open |

In order to separate gas sucked from a specific exhaust level (e.g. E2) from gas sucked by another exhaust level (e.g. E3) it is possible to connect each exhaust level to a different exhaust system. Such an exhaust system may contain elements for neutralizing the gas, denoxing (removing NO) and/or removing liquid residues (mist).

When lowering the chuck 2 the gas volume 47 below the chuck 2 is reduced. Therefore to avoid discharging gas against the second gas flow F2 might it be necessary to temporarily open the lower gas exhaust level or to generally increase exhaust flow E.

What is claimed is:

1. Device for wet treating a substrate, comprising:
   a spin chuck for holding and rotating the substrate about a rotation axis;
   at least one dispenser for dispensing a liquid onto at least one surface of said substrate;
   a liquid collector circumferentially surrounding said spin chuck for collecting liquid, which is spun off the substrate during rotation, with at least two collector levels for separately collecting liquids in different collectors;
   lifting means for moving said spin chuck relative to said liquid collector substantially along said rotation axis;
   at least two exhaust levels for separately collecting gas from the interior of the liquid collector;
   at least one exhaust influencing means, which is associated with said at least two exhaust levels, for selectively varying gas flow conditions in said at least two exhaust levels; and
   a computer that automatically sets an exhaust flow for each of said at least two exhaust levels based on a vertical position of said spin chuck relative to said liquid collector.

2. The device according to claim 1, wherein said at least one exhaust influencing means is a flow control modulating valve.

3. The device according to claim 1, wherein said at least one exhaust influencing means is a closing valve, whereby one of said at least two exhaust levels can be closed.

4. The device according to claim 1, wherein suction orifices of at least one of said at least two exhaust levels are connected to one of said two collector levels.

5. The device according to claim 1, wherein at least one of said at least two exhaust levels is arranged above or below one of said at least two collector levels.

* * * * *